United States Patent
Miyaji (10) Patent No.: US 7,390,679 B2
(45) Date of Patent: Jun. 24, 2008

(54) METHOD FOR MANUFACTURING FERROELECTRIC MEMORY DEVICE

(75) Inventor: Mamoru Miyaji, Kuwana (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/680,833

(22) Filed: Mar. 1, 2007

(65) Prior Publication Data
US 2007/0218568 A1   Sep. 20, 2007

(30) Foreign Application Priority Data
Mar. 9, 2006   (JP)   ............... 2006-064011

(51) Int. Cl.
*H01L 21/00* (2006.01)
(52) U.S. Cl. .............. 438/3; 257/295; 257/E21.208; 257/E21.436; 257/E21.663; 257/E21.664
(58) Field of Classification Search .............. 438/3; 257/295, E21.208, E21.436, E21.663, E21.664, 257/E27.104, E29.164, E29.272
See application file for complete search history.

(56) References Cited
U.S. PATENT DOCUMENTS
2003/0235969 A1*  12/2003  Yokota ................. 438/396
2004/0183116 A1*   9/2004  Cho et al. ............. 257/303
2005/0098815 A1*   5/2005  Okita et al. ............ 257/306
2005/0133842 A1*   6/2005  Okita .................... 257/295
2006/0009040 A1*   1/2006  Tomioka et al. ........ 438/710

FOREIGN PATENT DOCUMENTS
JP   2002-94019   3/2002

* cited by examiner

Primary Examiner—Hsien Ming Lee
Assistant Examiner—Ankush K Singal
(74) Attorney, Agent, or Firm—Harness, Dickey & Pierce, P.L.C.

(57) ABSTRACT

A method for manufacturing a ferroelectric capacitor, includes the steps of: forming a ferroelectric capacitor layer having a lower electrode layer, a ferroelectric layer and an upper electrode layer on a base substrate; forming a titanium oxide layer on the ferroelectric capacitor layer; patterning the titanium oxide layer by high-temperature etching between 200° C. and 500° C. to thereby form a mask pattern; and etching the ferroelectric capacitor layer by using the mask pattern as a mask, to thereby form a ferroelectric capacitor having a lower electrode, a ferroelectric film and an upper electrode.

4 Claims, 5 Drawing Sheets

METHOD FOR MANUFACTURING FERROELECTRIC MEMORY DEVICE

The entire disclosure of Japanese Patent Application No. 2006-064011, filed Mar. 9, 2006 is expressly incorporated by reference herein.

BACKGROUND

1. Technical Field

The present invention relates to methods for manufacturing ferroelectric memory devices having ferroelectric capacitors.

2. Related Art

A ferroelectric memory device (FeRAM) is composed with ferroelectric capacitors, and is a nonvolatile memory that is capable of low voltage and high speed operations. In such a ferroelectric memory device, its memory cell can be composed of, for example, one transistor and one capacitor (1T/1C), such that integration to the level of DRAM is possible. Accordingly, ferroelectric memory devices are highly expected as large capacity nonvolatile memories in recent years.

A ferroelectric capacitor in such a ferroelectric memory device is formed from a lower electrode, a ferroelectric film and an upper electrode. When the ferroelectric capacitor is formed, normally, a layer composed of a material for the lower electrode, a layer composed of a ferroelectric material, and a layer composed of a material for the upper electrode are successively laminated, and these layers are etched and patterned together. As masks that are used for etching, hard masks such as oxide (e.g., $SiO_2$) films are used more in recent years, because resist masks cannot provide sufficient etching resistance (see, for example, Japanese laid-open patent application JP-A-2002-94019). Moreover, when oxide ($SiO_2$) films are not sufficient, the use of titanium nitride (TiN) films as hard masks has been proposed.

When a titanium nitride (TiN) film is used as a hard mask, normally, a second mask pattern composed of $SiO_2$ is formed as a mask for patterning the titanium nitride film, and the second mask pattern is used to form a mask pattern composed of a titanium nitride film. As sufficient etching resistance may not be obtained with the titanium nitride film, normally, the obtained mask pattern composed of a titanium nitride film and the second mask pattern are used together as a laminated hard mask, and ferroelectric capacitor layers are etched together, thereby forming a ferroelectric capacitor.

However, the hard mask described above has a total thickness of about 900 nm, in which the thickness of the $SiO_2$ film is about 700 nm, and the thickness of the TiN film is about 200 nm. On the other hand, a separation between adjacent ferroelectric capacitors is normally about 600 nm. Accordingly, the hard mask described above has a high aspect ratio, and etching of a lower electrode side that is a bottom side of the ferroelectric capacitor may not be favorably etched, and therefore there is a possibility that the adjacent ferroelectric capacitors are conductively connected to each other. In order to prevent conduction between adjacent ferroelectric capacitors, presently, excessive over-etching needs to be conducted. However, when over-etching is conducted excessively, sidewall surfaces of the obtained ferroelectric capacitors become roughened, which makes it difficult to obtain favorable ferroelectric characteristics.

SUMMARY

In accordance with an advantage of some aspects of the invention, it is possible to provide a method for manufacturing a ferroelectric memory device, by which the workability at the time of forming ferroelectric capacitors is improved, and ferroelectric capacitors having favorable ferroelectric characteristics can be formed.

Because titanium oxides such as titania ($TiO_2$) are difficult to be etched, and therefore hard to be patterned, it was considered in the past that titanium oxides could not be used as hard masks. However, as a result of diligent study and research by the inventor of the present application, it has been discovered that titanium oxide can have a moderate etching rate and therefore can be patterned in high-temperature etching at 200° C. or higher, and therefore can be used as hard masks. The inventor has thus completed the invention based of the discovery described above.

A method for manufacturing a ferroelectric capacitor in accordance with an embodiment of the invention includes the steps of: forming a ferroelectric capacitor layer having a lower electrode layer, a ferroelectric layer and an upper electrode layer on a base substrate; forming a titanium oxide layer on the ferroelectric capacitor layer; patterning the titanium oxide layer by high-temperature etching between 200° C. and 500° C. to thereby form a mask pattern; and etching the ferroelectric capacitor layer by using the mask pattern as a mask, to thereby form a ferroelectric capacitor having a lower electrode, a ferroelectric film and an upper electrode.

According to the method for manufacturing a ferroelectric capacitor set forth above, etching is conducted by using titanium oxide that is difficult to be etched and thus has great etching resistance as a mask pattern to form the ferroelectric capacitor, whereby the mask pattern composed of titanium oxide can be made relatively thin. Accordingly, the aspect ratio of the mask to be used for forming the ferroelectric capacitor is relatively lowered, and the ferroelectric capacitor can be etched favorably to its bottom side. As a consequence, problems as such roughened sidewall surfaces of the ferroelectric capacitor that may be caused by excessive over-etching, and the resultant difficulty to obtain good ferroelectric characteristics can be avoided.

Moreover, the mask pattern is formed by patterning a titanium oxide layer in high-temperature etching between 200° C. and 500° C. Therefore, although titanium oxide is difficult to be etched at room temperature as described above, it can be patterned by etching particularly when it is conducted at 200° C. or higher. Also, since the etching is conducted at 500° C. or lower, other components such as a driving transistor for driving the ferroelectric capacitor to be obtained can be prevented from being thermally damaged.

In the method for manufacturing a ferroelectric memory device, the step of forming the mask pattern may preferably include the steps of: forming a second mask pattern on the titanium oxide layer, and etching the titanium oxide layer in high-temperature etching by using the second mask pattern to thereby form a mask pattern, wherein the step of forming the ferroelectric capacitor may preferably be conducted by etching and patterning the ferroelectric capacitor layer, using a laminated mask pattern composed of the mask pattern and the second mask pattern as a mask.

As a result, etching is conducted by using the laminated mask pattern composed of the mask pattern and the second mask pattern, such that the burden on the mask pattern composed of titanium oxide is reduced, and the film thickness thereof can be made smaller. Accordingly, etching of the titanium oxide layer that is difficult to be etched can be reduced to a necessity minimum.

Also, in the method for manufacturing a ferroelectric memory device, the step of forming the second mask pattern may preferably include the steps of: forming a silicon oxide layer by a chemical phase deposition method with tetraethoxysilane as a raw material, and patterning the silicon oxide layer by etching to form the second mask pattern composed of silicon oxide.

Formation of a silicon oxide layer by a chemical vapor deposition method using tetraethoxysilane as a raw material is a relatively easy film forming method, and the obtained silicon oxide layer can be readily etched and has good workability, whereby formation of the second mask pattern becomes easier.

In the method for manufacturing a ferroelectric memory device, in the step of forming the ferroelectric capacitor layer on the base substrate an oxygen barrier layer may preferably be formed between the base substrate and the lower electrode, and in the step of forming the ferroelectric capacitor, the ferroelectric capacitor having an oxygen barrier film, the lower electrode, the ferroelectric film and the upper electrode may preferably be formed.

Because the oxygen barrier film is formed between the base substrate and the lower electrode, oxidation of a plug formed in the base substrate and the resultant substantial increase in its resistance in a heat treatment that may be conducted in an oxygen atmosphere after forming the ferroelectric capacitor (in a recovery annealing to recover characteristics of the ferroelectric film) can be prevented. Accordingly, electrical conductivity between the plug and the lower electrode can favorably be secured.

DESCRIPTION OF EXEMPLARY EMBODIMENTS

Preferred embodiments of the invention are described in detail below. Prior to description of a method for manufacturing a ferroelectric memory device in accordance with an embodiment of the invention, an example of the ferroelectric memory device obtained by the method is described.

Figure 1:
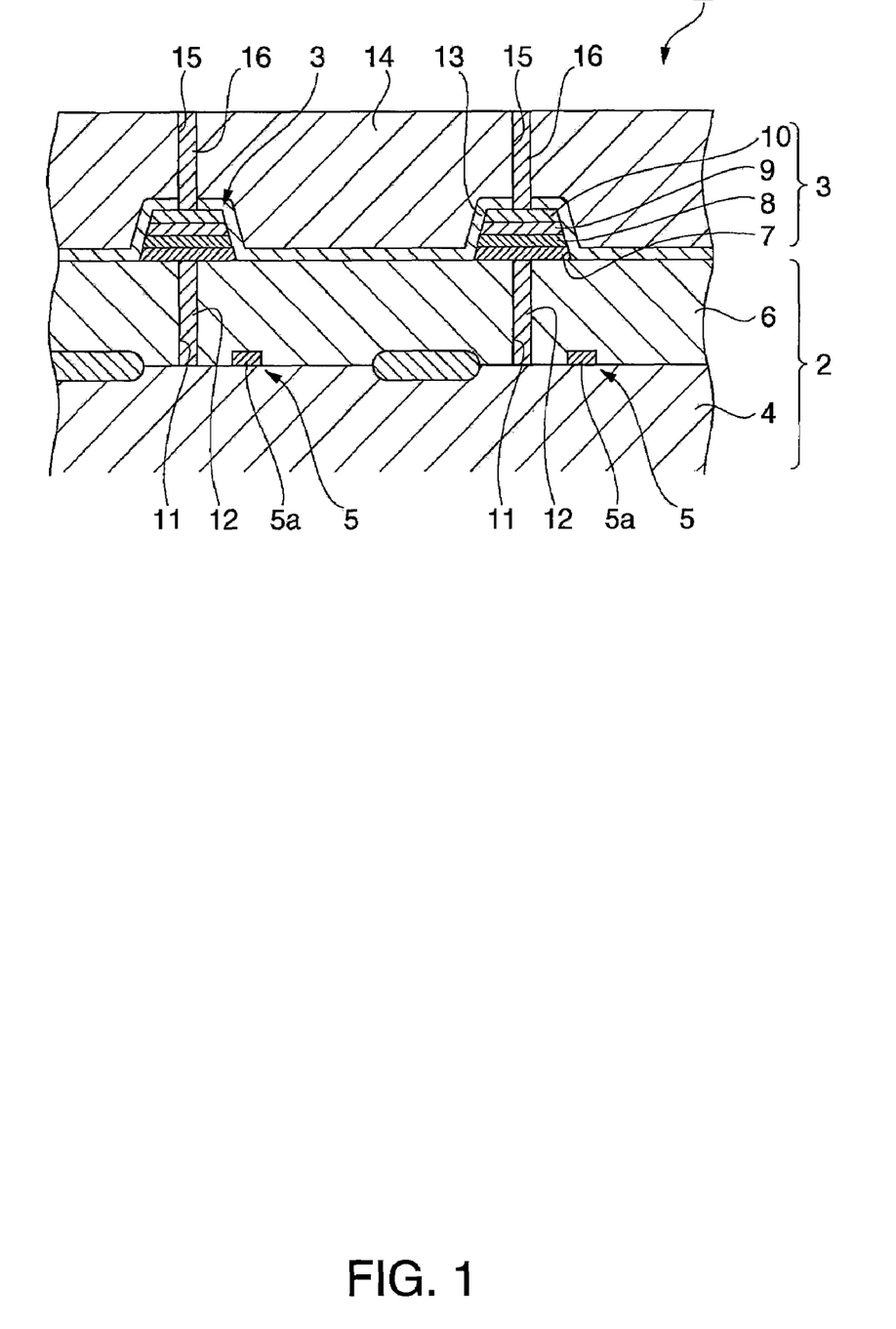
FIG. 1 is a cross-sectional view in part of a ferroelectric memory device in accordance with an embodiment of the invention.

FIG. 1 is a cross-sectional view in part of a ferroelectric memory device in accordance with an embodiment of the invention. Reference numeral 1 in the figure denotes a ferroelectric memory device. The ferroelectric memory device 1 is of a stacked type having a 1T/1C memory cell structure, and is equipped with a base substrate 2, and a plurality of ferroelectric capacitors 3 provided on the base substrate 2.

The base substrate 2 is formed from a silicon substrate (i.e., a semiconductor substrate) 4. Transistors 5 for driving the ferroelectric capacitors 4 are formed on a top surface portion of the silicon substrate 4, and a base dielectric film 6 that covers the driving transistors 5 is formed above the silicon substrate 4. Source and drain regions (not shown) and channel regions (not shown) composing the driving transistors 5 are formed in the silicon substrate 4, and gate dielectric films (not shown) are formed over the channel regions. Further, gate electrodes 5a are formed on the gate dielectric films, thereby forming the driving transistors 5, respectively.

It is noted that the driving transistors 5 corresponding to the respective ferroelectric capacitors 3 are electrically isolated from one another by embedded isolation regions (not shown) formed in the silicon substrate 4. Further, the base dielectric film 6 may be composed of silicon oxide ($SiO_2$), and planarized by a CMP (chemical mechanical polishing) method or the like.

Over the base substrate 2 where the driving transistors 5 and the base dielectric film 6 are formed on the silicon substrate 4, the ferroelectric capacitors 3 are formed on the base dielectric film 6. Each of the ferroelectric capacitors 3 is composed of an oxygen barrier film 7 formed on the base dielectric film 6, a lower electrode 8 formed on the oxygen barrier film 7, a ferroelectric film 9 formed on the lower electrode 8, and an upper electrode 10 formed on the ferroelectric film 9.

The oxygen barrier film 7 may be composed of, for example, TiAlN, TiAl, TiSiN, TiN, TaN, TaSiN or the like. Above all, TiAlN including titanium, aluminum and nitrogen is suitable, and the oxygen barrier film 7 is formed from TiAlN in the present example.

The lower electrode 8 and the upper electrode 10 may be formed from, for example, iridium (Ir), iridium oxide ($IrO_x$), platinum (Pt), ruthenium (Ru), ruthenium oxide ($RuO_x$) or the like. In the present example, the lower electrode 8 and the upper electrode 10 are formed from iridium.

The ferroelectric film 9 is composed of material having a perovskite crystal structure, which may be expressed by a general formula, $ABXO_3$. Concretely, the ferroelectric film 9 is composed of Pb (Zr, Ti)$O_3$ (PZT), (Pb, La) (Zr, Ti) $O_3$ (PLZT), or a ferroelectric material in which metal such as niobate (Nb) or the like is added to the foregoing material. In the present embodiment example, the ferroelectric film 9 is formed from PZT.

A bottom portion of the oxygen barrier film 7 is connected to a contact hole 11 formed in a manner to penetrate the base dielectric film 6. With this structure, the lower electrode 8 on the oxygen barrier film 7 is conductively connected to a plug 12 formed in the contact hole 11. The plug 12 is connected to one of the source and drain regions of the driving transistor 5, whereby the ferroelectric capacitor 3 is operated by the driving transistor 5, as described above. It is noted that the plug 12 embedded in the contact hole 11 is formed from tungsten (W) in the present example.

Also, a dielectric hydrogen barrier film 13 that covers the ferroelectric capacitors 3 is formed on the base dielectric film 6. The hydrogen barrier film 13 exhibits a hydrogen barrier function, thereby protecting the ferroelectric film 9 whose electrical characteristics would likely be lowered, particularly, due to the reducing action of hydrogen. As the dielectric hydrogen barrier film 13, aluminum oxide such as alumina (AlOx), titanium oxide such as titania (TiOx), zircon oxide such as zirconia (ZrOx) or the like is used, and in particular, alumina (AlOx) is preferably used. Accordingly, in the present example, the hydrogen barrier film 13 is composed of alumina (AlOx).

An interlayer dielectric film 14 is formed on the hydrogen barrier film 13. The interlayer dielectric film 14 is formed from silicon oxide ($SiO_2$), like the base dielectric film 6, and planarized by a CMP (chemical mechanical polishing) method or the like. Contact holes 15, which connect to the upper electrodes 10, are formed in the interlayer dielectric film 14, and plugs 16 are embedded in the contact holes 15. The ferroelectric capacitors 3 having such a structure as described above are driven by the driving transistors 5 and conductive sections (not shown) connected to the plugs 16, respectively. Further, a second interlayer dielectric film (not shown) that covers the conductive sections may be formed on the interlayer dielectric film 14.

Next, a method for manufacturing a ferroelectric memory device in accordance with an embodiment of the invention is described based on the method for manufacturing the ferroelectric memory device 1 having the structure described above.

Figure 2A:
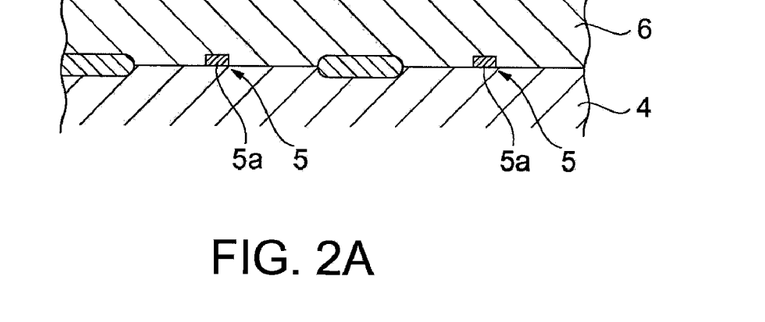
FIGS. 2A-2C are views for describing steps of a method for manufacturing the device shown in FIG. 1.

First, as shown in FIG. 2A, driving transistors 5 are formed in advance on a silicon substrate 4 by a known method. Then, a silicon oxide ($SiO_2$) film is formed by a CVD method or the like, and planarized by a CMP method, thereby forming a base dielectric film 6.

Figure 2B:
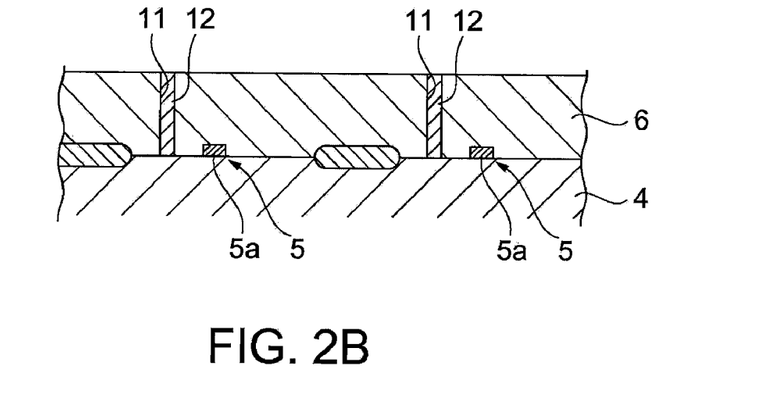

Then, a resist pattern (not shown) is formed on the base dielectric film 6 by known resist technique and exposure and development technique, and etching is conducted by using the resist pattern as a mask, thereby forming contact holes 11, as shown in FIG. 2B.

Then, tungsten (W) as a plug material is formed into a film by a sputter method or the like, whereby the tungsten is embedded in the contact holes 11. Then, a portion of the tungsten on the base dielectric film 6 is removed by a CMP method or the like, whereby plugs 12 composed of tungsten are embedded in the contact holes 11. It is noted that, when forming the plugs 12, prior to embedding tungsten, an adhesion layer composed of TiN (titanium nitride) or the like may preferably be formed in a thin film on inner wall surfaces of the contact holes 11, and then, tungsten is embedded in the contact holes 11, as described above.

Figure 2C:
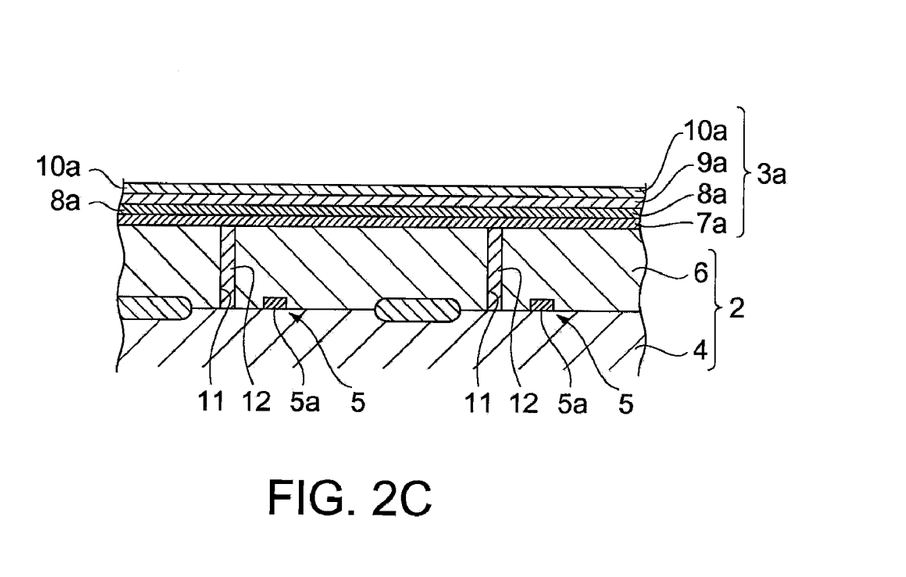

Then, for forming ferroelectric capacitors 3 on the base dielectric film 6, first, a forming material of an oxygen barrier film 7 that covers upper surfaces of the plugs 12 is formed on the base dielectric film 6. More concretely, a film of TiAlN is formed by a sputter method or the like, thereby forming an oxygen barrier layer 7a, as shown in FIG. 2C. Then, a film of iridium that is a forming material of a lower electrode 8 is formed on the oxygen barrier layer 7a by a sputter method or the like, thereby forming a lower electrode layer 8a.

Then, a film of PZT that is a forming material of a ferroelectric film 9 is formed on the lower electrode layer 8a by, for example, a sputter method, a spin-on method, a MOCVD method or the like, thereby forming a ferroelectric layer 9a. Then, a film of iridium that is a forming material of an upper electrode 10 is formed on the ferroelectric layer 9a by a sputter method or the like, thereby forming an upper electrode layer 10a. In this manner, the oxygen barrier layer 7a, the lower electrode layer 8a, the ferroelectric layer 9a and the upper electrode layer 10a are laminated, whereby a ferroelectric capacitor layer 3a in accordance with the present embodiment can be obtained.

Figure 3A:
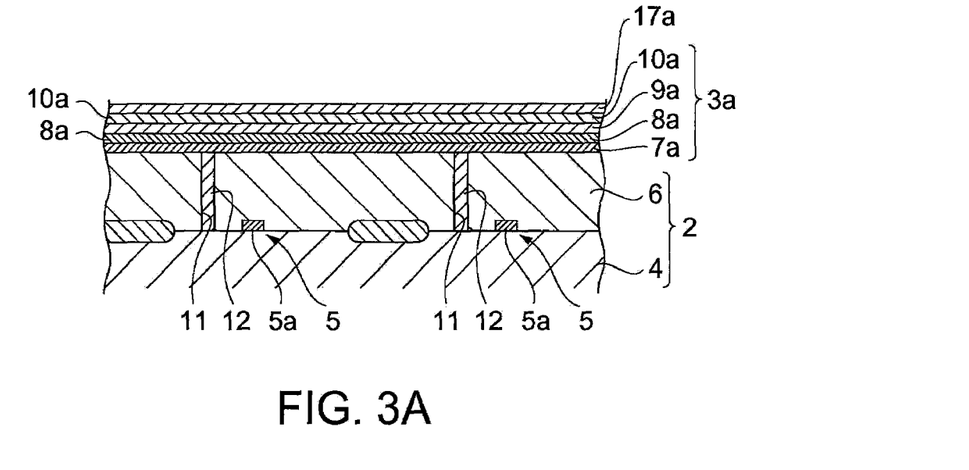
FIGS. 3A-3C are views for describing steps of the method for manufacturing the device shown in FIG. 1.

Then, as shown in FIG. 3A, a film of titanium oxide ($TiO_x$ such as $TiO_2$) is formed on the ferroelectric capacitor layer 3a, in other words, on the upper electrode layer 10a, thereby forming a titanium oxide layer 17a to a thickness of, for example, about 50-100 nm. Then, a second mask material is provided on the titanium oxide layer 17a in a film that becomes to be a mask for patterning the titanium oxide layer 17a, thereby forming a second mask material layer (not shown).

It is noted that, as the second mask material that forms the second mask material layer, silicon oxide ($SiO_x$ such as $SiO_2$) may preferably be used. As a method of forming the second mask material layer composed of silicon oxide (a silicon oxide layer), a chemical vapor deposition (CVD) method using tetraethoxysilane (TEOS) as a raw material is particularly suitable. Accordingly, in accordance with the present embodiment, the second mask material layer (a silicon oxide layer) is formed by a CVD method using TEOS as a raw material. Film formation of the silicon oxide layer (the second mask material layer 18a) by a CVD method using TEOS as a raw material is a relatively easy film forming method, and the obtained silicon oxide layer can be readily etched, and thus has good workability, such that a second mask pattern can be readily formed from the silicon oxide layer (the second mask material layer), as described below.

Figure 3B:
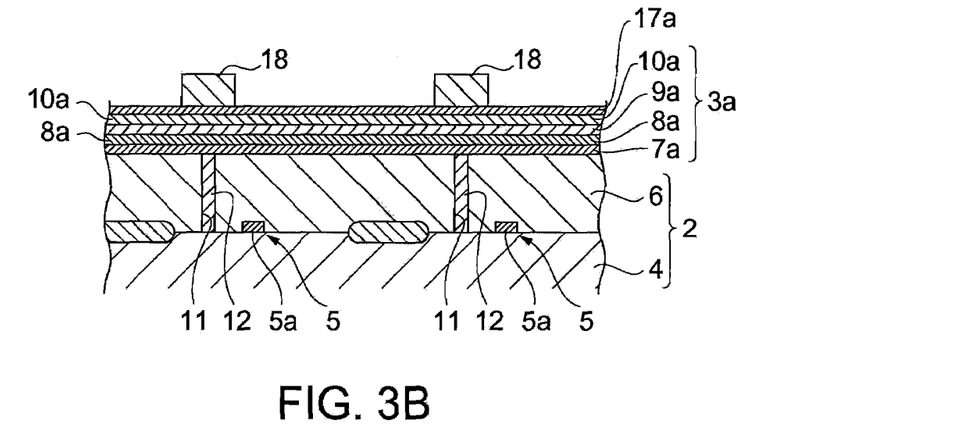

Then, a resist pattern (not shown) is formed on the second mask material layer by known resist technique and exposure and development technique, and the second mask material layer is etched by using the resist pattern as a mask, whereby a second mask pattern 18 is formed, as shown in FIG. 3B. It is noted that FIG. 3B shows a state in which, after the second mask pattern 18 has been formed, the resist pattern is removed by ashing or the like.

Figure 3C:
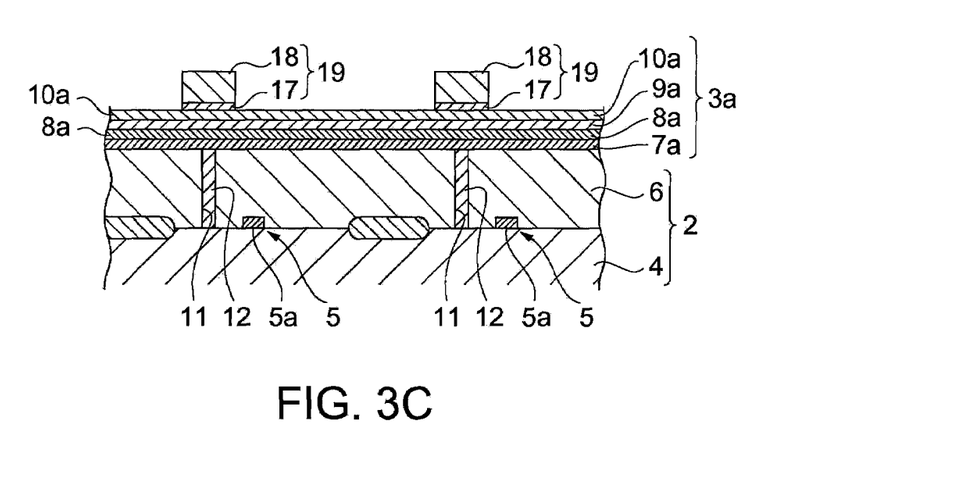

Then, the titanium oxide layer 17a is etched by high-temperature etching, using the second mask pattern 18 as a mask, thereby forming a mask pattern 17, as shown in FIG. 3C. The high-temperature etching may be conducted in a temperature range between 200° C. and 500° C. in accordance with the present embodiment of the invention, and may preferably be conducted in a temperature range between 350° C. and 450° C. More concretely, the base substrate 2 is set to a retaining section within an etching apparatus (a high-temperature etcher), the base substrate 2 is then heated in the temperature range described above, and etching is conducted. Etching gas may be pre-heated depending on the requirements, and then supplied in the etching apparatus. As the etching method, a reactive ion etching (RIE) method using a single gas of $Cl_2$, $BCl_3$, $CF_4$, $C_2F_6$ or $C_4F_8$, or a mixed gas of the aforementioned gas and Ar or He may preferably be used.

The temperature range in the high-temperature etching is set between 200° C. and 500° C., because titanium oxide such as titania ($TiO_2$) is hardly etched and therefore patterning thereof is substantially difficult at temperatures less than 200° C. However, if the temperature exceeds over 500° C., other components, such as, for example, the driving transistors 5 formed on the base substrate 2 may be thermally damaged, and their characteristics may be negatively affected. In order to prevent the problems described above more securely, and in order to conduct favorable etching without causing thermal damage on the other components, the temperature range is preferably set between 350° C. and 450° C.

After the mask pattern 17 has been formed in a manner described above, the second mask pattern 18 used for forming the mask pattern 17 is left as it is without being removed, and the mask pattern 18 and the mask pattern 17 are left together as a laminated mask pattern 19. Then, as shown in FIG. 4A, the ferroelectric capacitor layer 3a is etched and patterned by using the laminated mask pattern 19.

Figure 4A:
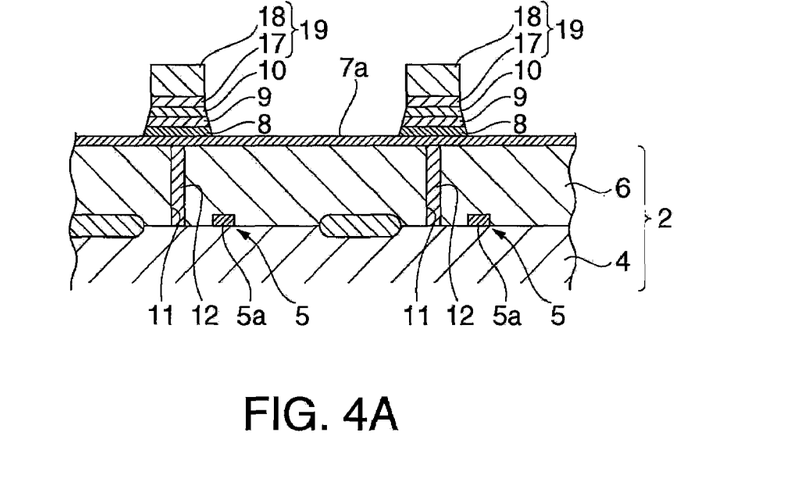
FIGS. 4A-4C are views for describing steps of the method for manufacturing the device shown in FIG. 1.
Figure 4B:
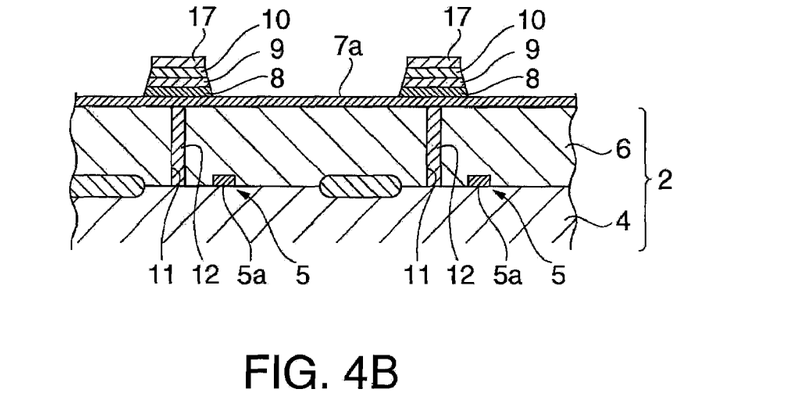
Figure 4C:
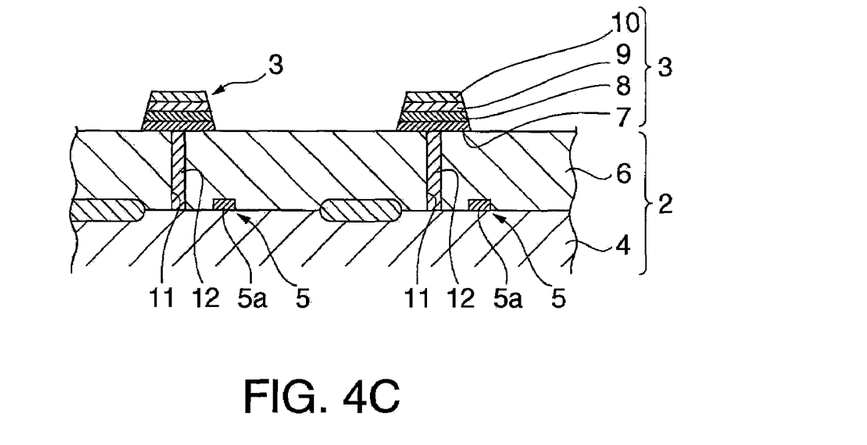

However, in accordance with the present embodiment of the invention, in particular, when the upper electrode layer 10a, the ferroelectric layer 9a and the lower electrode 8a among the ferroelectric capacitor layer 3a are etched, the etching is stopped once, as shown in FIG. 4A. Then, the base substrate 2 is taken out of the etching apparatus (i.e., a high-temperature etcher) and placed in a dry etcher, where the second mask pattern 18 alone is selectively removed, as shown in FIG. 4B. Then, the base substrate 2 is returned to the high-temperature etcher, where etching is conducted again by using the remaining mask pattern 17 alone as a mask to pattern the oxygen barrier layer 7a, as shown in FIG. 4C, thereby forming the ferroelectric capacitors 3.

It is noted that, in particular, etching of the oxygen barrier layer 7a may be conducted by high-temperature etching, like etching of the titanium oxide layer 17a, such that the mask pattern 17 can be etched, concurrently with patterning (etching) of the oxygen barrier layer 7a. Through concurrently etching the mask pattern 17 in this manner, patterning of the oxygen barrier layer 7a would be completed, and the mask pattern 17 would be removed by etching, when the ferroelectric capacitor 3 is obtained. It is noted that the adjustment of film thickness can be conducted through appropriately setting in advance the thicknesses of the oxygen barrier layer 7a and the mask pattern 17 to specified values, etching conditions and the like based on experiments and the like.

In the case of etching that uses the laminated mask pattern 19 as a mask, the total thickness of the laminated mask pattern 19 would become to be about 750 nm-800 nm, which is smaller compared with a conventional mask pattern that is about 900 nm, when the second mask pattern 18 composed of silicon oxide is formed to be about 700 nm in thickness like the conventional one, as the mask pattern 17 composed of titanium oxide is particularly thin, which is about 50-100 nm. As a result the aspect ratio becomes lower, and the ferroelectric capacitor layer 3a can be favorably etched to the side of its bottom portion (the lower electrode layer 8a). Further, in particular, as the oxygen barrier layer 7a is also patterned by using the mask pattern 17, the ferroelectric capacitors 3 can be favorably formed without conducting excessive over-etching.

Figure 5A:
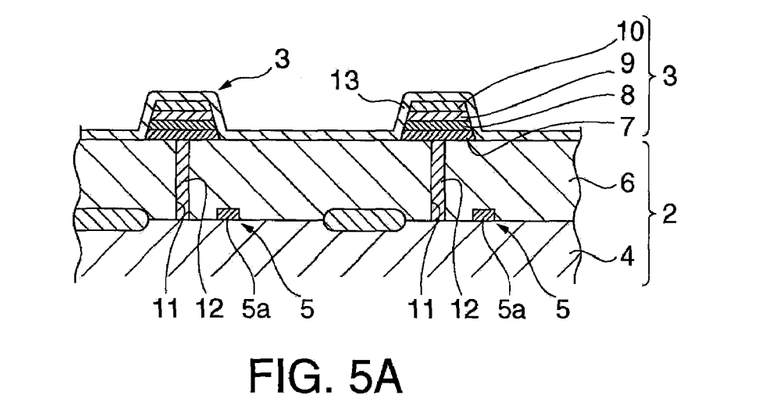
FIGS. 5A-5C are views for describing steps of the method for manufacturing the device shown in FIG. 1.
Figure 5B:
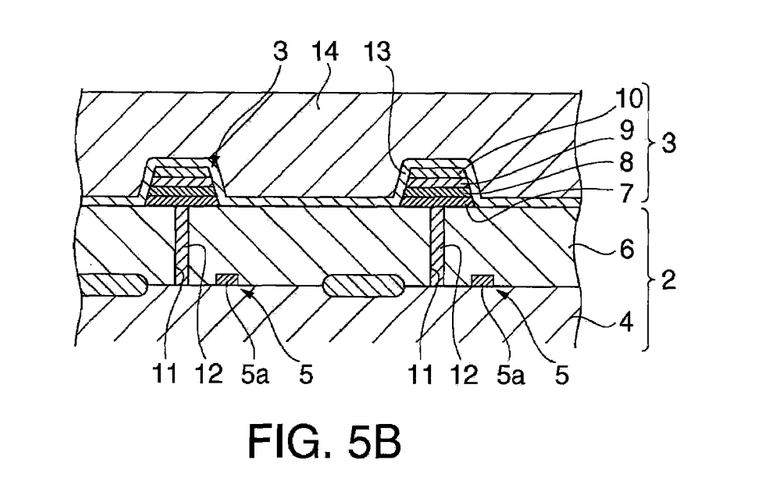

Then, as shown in FIG. 5A, AlOx that covers the obtained ferroelectric capacitors 3 is deposited in a film by a sputter method, a CVD method or the like over the base dielectric film 6, thereby forming a hydrogen barrier film 13. Then, a film of silicon oxide ($SiO_2$) is formed on the formed hydrogen barrier film 13 by a CVD method or the like, and further planarized by a CMP method or the like, thereby forming an interlayer dielectric film 14, as shown in FIG. 5B.

Figure 5C:
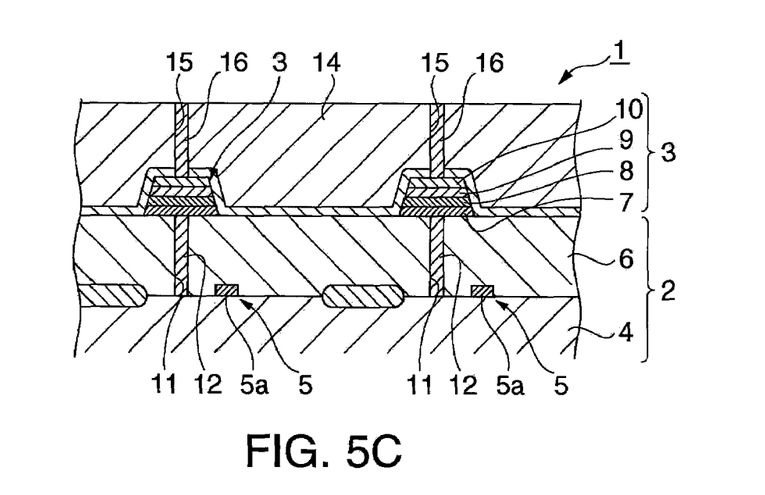

Next, a resist pattern (not shown) is formed on the interlayer dielectric film 14 by known resist technique and exposure and development technique, and the interlayer dielectric film 14 is etched by using the resist pattern as a mask, thereby forming contact holes 15 that connect to the upper electrodes 10, as shown in FIG. 5C. Then, plugs 16 are embedded in the contact holes 15. Further, conduction sections (not shown) such as wirings that are conductively connected to the plugs 16 are formed, and a second interlayer dielectric film (not shown) that covers the aforementioned layers and wirings is formed, whereby the ferroelectric memory device 1 in accordance with the present embodiment is obtained.

According to the method for manufacturing the ferroelectric memory device 1 described above, titanium oxide that is difficult to be etched and thus has large etching resistance is used as the mask pattern 17, and etching is conducted using the mask pattern 17 and the second mask pattern 18 as the laminated mask pattern 19, to thereby pattern the ferroelectric capacitors 3. As a result, the aspect ratio of the mask at the time of forming the ferroelectric capacitor 3 can be made relatively low, compared to the conventional one, and therefore the ferroelectric capacitor 3 can be favorably etched to the side of its bottom portion. As a consequence, the workability at the time of forming the ferroelectric capacitors 3 can be improved, and excessive over-etching can be made unnecessary, such that sidewall surfaces of the ferroelectric capacitors 3 can be prevented from being roughened due to excessive over-etching, and the ferroelectric capacitors 3 with excellent ferroelectric characteristics can be formed.

Also, etching is conducted by using the laminated mask pattern 19 composed of the mask pattern 17 and the second mask pattern 18 as a mask, such that the burden on the mask pattern composed of titanium oxide is lessened and the film thickness thereof can be made smaller, and therefore etching for the titanium oxide layer that is difficult to be etched can be suppressed to a necessity minimum. Furthermore, in particular, the mask pattern 17 is etched concurrently with patterning (etching) of the oxygen barrier layer 7a, such that the step of removing only the mask pattern 17 by etching can be omitted, and therefore the productivity can be improved.

It is noted that the ferroelectric memory device 1 is applicable to various electronic devices, such as, for example, cellular phones, personal computers, liquid crystal devices, electronic notebooks, pagers, POS terminals, IC cards, mini-disc players, liquid crystal projectors, engineering workstations (EWS), word processors, televisions, view finder or monitor-direct viewing type video recorders, electronic desktop calculators, car-navigation systems, devices equipped with touch-panels, clocks, gaming devices, and electrophoretic devices.

Also, the invention is not limited to the embodiments described above, and many changes can be made without departing from the subject matter of the invention. For example, in the embodiment described above, the ferroelectric capacitor layer 3a is etched by using the laminated mask pattern 19 composed of the mask pattern 17 and the second mask pattern 18 as a mask. However, the ferroelectric capacitor layer 3a may be etched and patterned by using only the mask pattern 17 composed of titanium oxide as a mask. Also, in the embodiment described above, the mask pattern 17 is composed only of titanium oxide (TiOx). However, for example, a layer titanium oxide (TiOx) and a layer of TiN may be laminated to form a laminated film composed of TiOx (lower layer)/TiN (upper layer), or a laminated film composed of TiN (lower layer)/TiOx (upper layer), and such a laminated film may be used as a mask pattern.

What is claimed is:

1. A method for manufacturing a ferroelectric capacitor, comprising the steps of:

forming a ferroelectric capacitor layer having a lower electrode layer, a ferroelectric layer and an upper electrode layer on a base substrate;

forming a titanium oxide layer on the ferroelectric capacitor layer;

patterning the titanium oxide layer by high-temperature etching between 200° C. and 500° C. to thereby form a mask pattern; and etching the ferroelectric capacitor layer by using the mask pattern as a mask, to thereby form a ferroelectric capacitor having a lower electrode, a ferroelectric film and an upper electrode.

2. A method for manufacturing a ferroelectric memory device according to claim 1, wherein the step of forming the mask pattern includes forming a second mask pattern on the titanium oxide layer, and etching the titanium oxide layer at the high-temperature by using the second mask pattern to thereby form a mask pattern, wherein the step of forming the ferroelectric capacitor includes etching and patterning the ferroelectric capacitor layer by using a laminated mask pattern composed of the mask pattern and the second mask pattern as a mask.

3. A method for manufacturing a ferroelectric memory device according to claim 2, wherein the step of forming the second mask pattern includes forming a silicon oxide layer by a chemical phase deposition method with tetraethoxysilane as a raw material, and patterning the silicon oxide layer by etching to form the second mask pattern composed of silicon oxide.

4. A method for manufacturing a ferroelectric memory device according to claim 1, wherein the step of forming the ferroelectric capacitor layer on the base substrate includes forming an oxygen barrier layer between the base substrate and the lower electrode, and the step of forming the ferroelectric capacitor includes forming the ferroelectric capacitor to have an oxygen barrier film, the lower electrode, the ferroelectric film and the upper electrode.

* * * * *